United States Patent
Zhang et al.

(10) Patent No.: US 9,343,836 B2
(45) Date of Patent: May 17, 2016

(54) ELECTRICAL SOCKET HAVING IMPROVED CAM

(71) Applicant: HON HAI PRECISION INDUSTRY CO., LTD., New Taipei (TW)

(72) Inventors: Wen-Qiang Zhang, Shenzhen (CN); Hui Ye, Shenzhen (CN); Quan Wang, Shenzhen (CN)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/265,367

(22) Filed: Apr. 30, 2014

(65) Prior Publication Data

US 2014/0329403 A1 Nov. 6, 2014

(30) Foreign Application Priority Data

May 3, 2013 (CN) ......................... 2013 1 01601595

(51) Int. Cl.
*H01R 4/50* (2006.01)
*H01R 13/193* (2006.01)
*H05K 7/10* (2006.01)

(52) U.S. Cl.
CPC ............ *H01R 13/193* (2013.01); *H05K 7/1007* (2013.01)

(58) Field of Classification Search
CPC ............................. H01R 13/193; H01R 13/20
USPC ......................... 439/259–270, 342
See application file for complete search history.

(56) References Cited

U.S. PATENT DOCUMENTS

| | | | |
|---|---|---|---|
| 6,250,941 B1 | 6/2001 | Huang et al. | |
| 6,338,640 B1 * | 1/2002 | Lin | 439/342 |
| 6,669,498 B2 * | 12/2003 | Okita et al. | 439/342 |
| 6,692,281 B1 * | 2/2004 | McClinton et al. | 439/342 |
| 6,733,321 B2 * | 5/2004 | Okita et al. | 439/342 |
| 7,056,140 B1 * | 6/2006 | Jiang | 439/342 |
| 7,094,090 B2 * | 8/2006 | He et al. | 439/342 |
| 7,114,978 B2 * | 10/2006 | He et al. | 439/342 |
| 7,771,224 B2 * | 8/2010 | Cheng et al. | 439/342 |
| 7,892,009 B2 * | 2/2011 | Szu | 439/342 |
| 8,172,598 B2 * | 5/2012 | Fan | 439/342 |
| 2005/0215094 A1 | 9/2005 | He et al. | |

FOREIGN PATENT DOCUMENTS

| | | |
|---|---|---|
| CN | 2402022 Y | 10/2000 |
| CN | 201355645 Y | 12/2009 |
| EP | 1014506 A | 6/2000 |
| TW | M382607 U | 6/2010 |
| TW | M408166 | 7/2011 |
| WO | WO2012108944 | 8/2012 |

* cited by examiner

*Primary Examiner* — Thanh Tam Le
(74) *Attorney, Agent, or Firm* — Wei Te Chung; Ming Chieh Chang (57) ABSTRACT

An electrical socket used for an electronic package with a plurality of pins, includes a base defining a number of passageways in a vertical direction. A number of contacts are received in the passageways. A cover is slidably mounted upon the base and defines a plurality of holes corresponding to the passageways. A cam is used for driving the cover horizontally moved along the base between an open position and a closed position. Wherein, the pins moves with regard to the contact in a linear return path when the electrical socket moved from the open position to the closed position or from the closed position to the open position.

13 Claims, 8 Drawing Sheets

ELECTRICAL SOCKET HAVING IMPROVED CAM

BACKGROUND OF THE INVENTION

1. Field of the Invention

The present invention relates to an electrical socket, and more particularly to an electrical socket having an improved cam to prolong a path which an electronic package moved in the electrical socket.

2. Description of Related Art

U.S. Pat. No. 6,250,941 issued to Huang et al. on Jun. 26, 2001 discloses a Zero Insertion Force (ZIF) socket for use with a Pin Grid Array (PGA) electronic package. The socket includes a base, a cover mounted upon the base, and a cam assembled between the base and the cover. The cam includes an upper portion and a lower portion. The upper portion is composed of an upper disk and a lower disk coaxial with the upper disk. The upper disk has a lateral protrusion protruding from a lateral side thereof. The lower portion is formed under the upper portion and parallel to but offset from the axis of the upper portion. The lower disk and the lower portion have a common tangent plane. The tangent plane is located on the lower portion offset direction. The offset direction and the lateral protrusion have a right angle.

Figure 1:
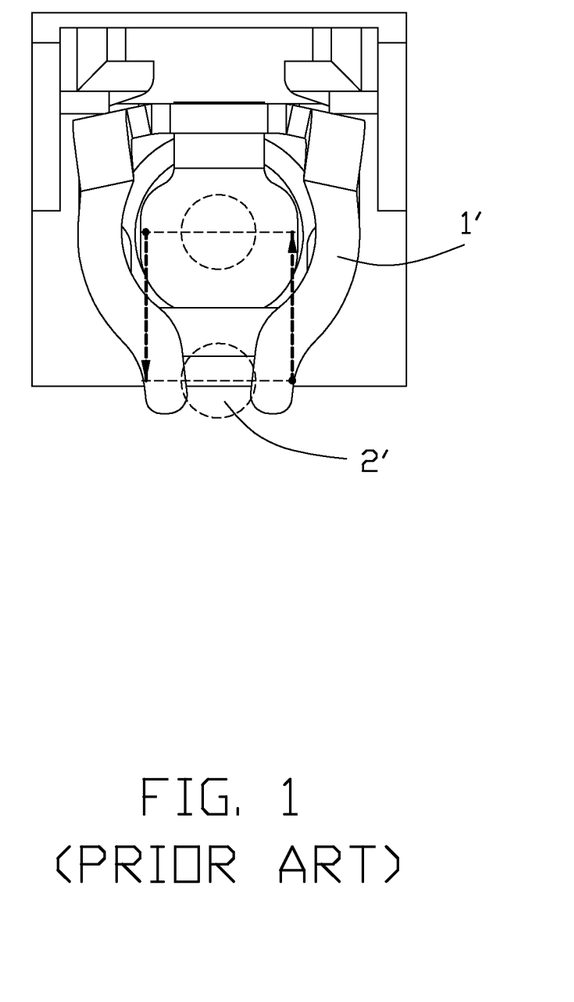
FIG. 1 is a schematic view of paths that a pin of an electrical package moving with regard to a contact in accordance with a conventional invention.

When the electronic package mounted upon the cover, the cam is rotated to drive the cover moving along the base between an open position and a closed position. FIG. 1 shows a relative position between a pin and a contact of the ZIF socket. When the ZIF socket is positioned at the closed position, the pin 2' engages with a mating portion 1' of the contact and located at an end position. When the cam is rotated 180 degree to the open position, the pin 2' drops out the mating portion 1' of contact and returned to an original position. The pin moves along a unilateral path from the closed position to the open position or from the open position to the closed position as arrows shown in FIG. 1.

The ZIF socket may cause the customs complaints for the pins not good engaging with the contacts and dropout the contacts, that's caused by many reasons, such as the contacts having big holding force.

Therefore, an improved electrical socket is needed.

SUMMARY OF THE INVENTION

An object of the present invention is to provide an improved cam to prolong a path which an electronic package moved in the electrical socket.

According to one aspect of the present invention, an electrical socket comprises a base defining a plurality of passageways in a vertical direction. A plurality of contacts are received in the passageways. A cover is slidably mounted upon the base and defines a plurality of holes corresponding to the passageways. A cam is used for driving the cover horizontally moved along the base between an open position and a closed position. The cam includes an upper portion and a lower portion offset from the upper portion. The upper portion has a lateral protrusion to restrict the cover located in the open position and the closed position with regard to the base. A center of the upper portion connects a center of the lower portion to form a center line. The center of the upper portion connects a center of the lateral protrusion to form a connecting line. wherein the center line and the connecting line have an acute angle.

According to another aspect of the present invention, an electrical socket used for an electronic package with a plurality of pins, comprises a base defining a plurality of passageways in a vertical direction. A plurality of contacts are received in the passageways. A cover is slidably mounted upon the base and defines a plurality of holes corresponding to the passageways. A cam is used for driving the cover horizontally moved along the base between an open position and a closed position. Wherein, the pins moves with regard to the contact in a linear return path when the electrical socket moved from the open position to the closed position or the from the closed position to the open position.

Other objects, advantages and novel features of the invention will become more apparent from the following detailed description of a preferred embodiment when taken in conjunction with the accompanying drawings.

DETAILED DESCRIPTION OF THE INVENTION

Figure 2:
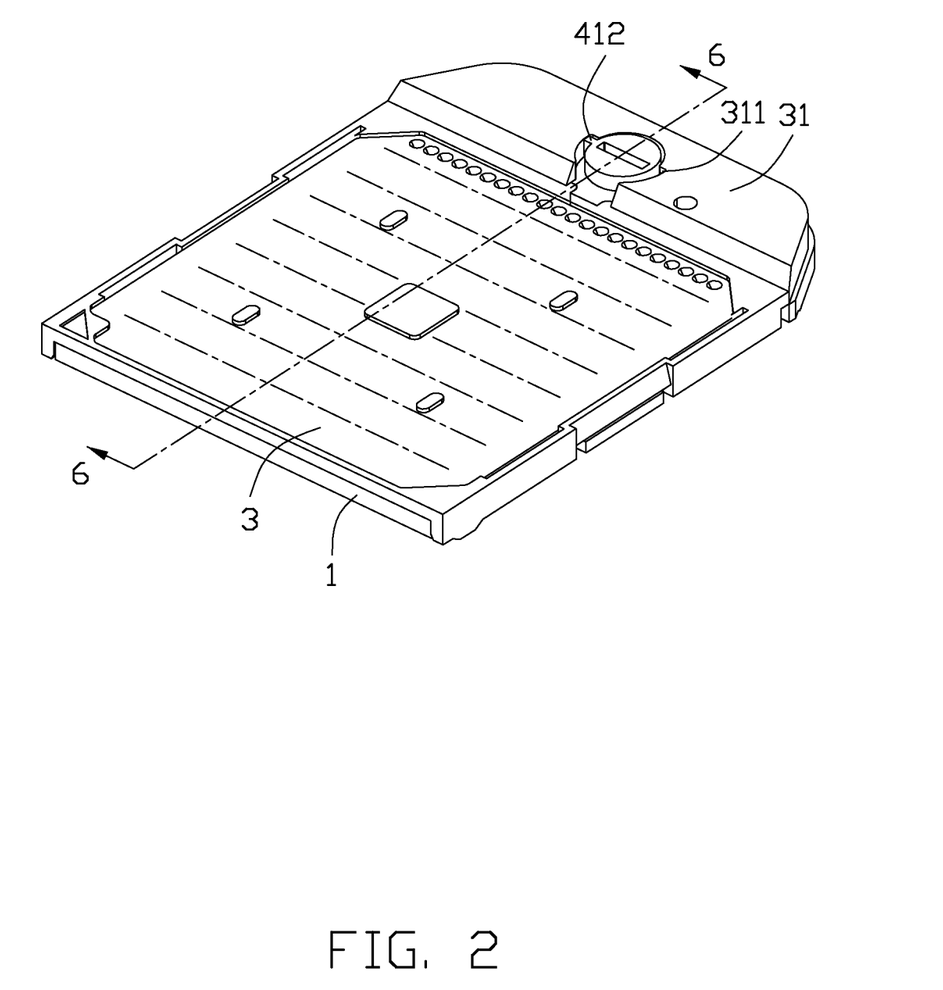
FIG. 2 is an assembled, perspective view of an electrical socket in accordance with the present invention.
Figure 3:
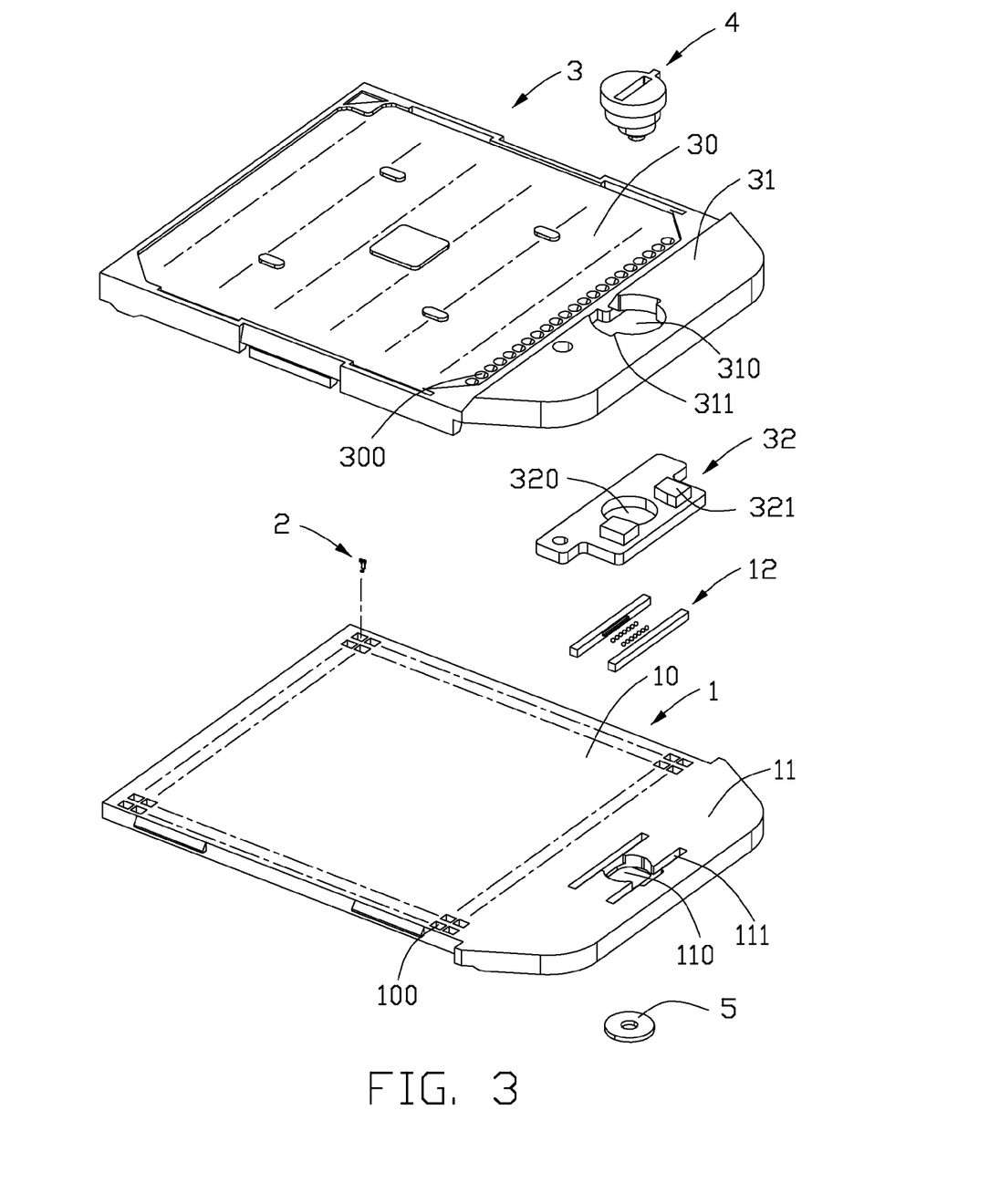
FIG. 3 is an exposed, perspective view of the electrical socket shown in FIG. 1.

Referring to FIGS. 2 to 3, an electrical socket used for electrically connecting a Pin Grid Array (PGA) electronic package and a printed circuit board, comprises an base 1, a plurality of contacts 2 received in the base 1, a cover 3, and a cam 4 received between the base 1 and the cover 3.

Referring to FIG. 3, the base 1 includes a receiving portion 10 and a head portion 11 located at one end of the receiving portion 10. The receiving portion 10 defines a plurality of passageways 100 to receive the contacts 2. The head portion 11 defines a through hole 110 with a pair of channels 111 disposed on two opposite sides of the through hole 110. The channels 111 are used to receive responding base plates 12 to increase the strength of the base 1.

Figure 8:
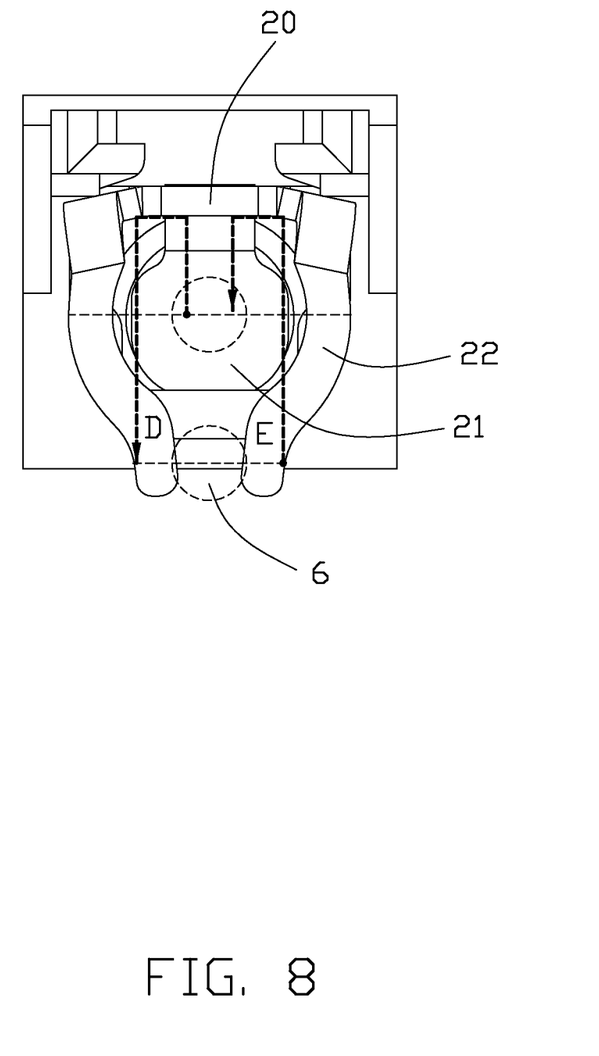
FIG. 8 is schematic view of paths that a pin of an electrical package moving with regard to a contact in accordance with the present invention.

Referring to FIG. 3 and FIG. 8, each contact 2 includes a retention portion 20 received in the passageway 100, a tail portion 21 extending from the retention portion 20, and a pair of mating portions 22 extending from the retention portion 20.

Referring to FIG. 3, the cover 3 includes a mating portion 30 corresponding to the receiving portion 10 and an end portion 31 corresponding to the head portion 31. The mating portion 10 defines a plurality of holes 300 corresponding to the passageways 100 for allowing the pins 6 of the electronic package to pass through and connect with the contacts 2. The end portion 31 defines an accommodating hole 310 corresponding to the through hole 110 of the head portion 11. The accommodating hole 310 forms a pair of blocks 311 at two opposite sides thereof. A cover plate 32 disposed at bottom of the end portion 31 to increase strength of the cover 3. The cover plate 32 defines a through aperture 320 to align with the accommodating hole 310 of the cover 3 and the through hole 110 of the base 1 in a vertical direction to accommodate the cam 4. A pair of protrusions 321 extend upwardly from two sides of the aperture 320 to align with the blocks 311.

Figure 4:
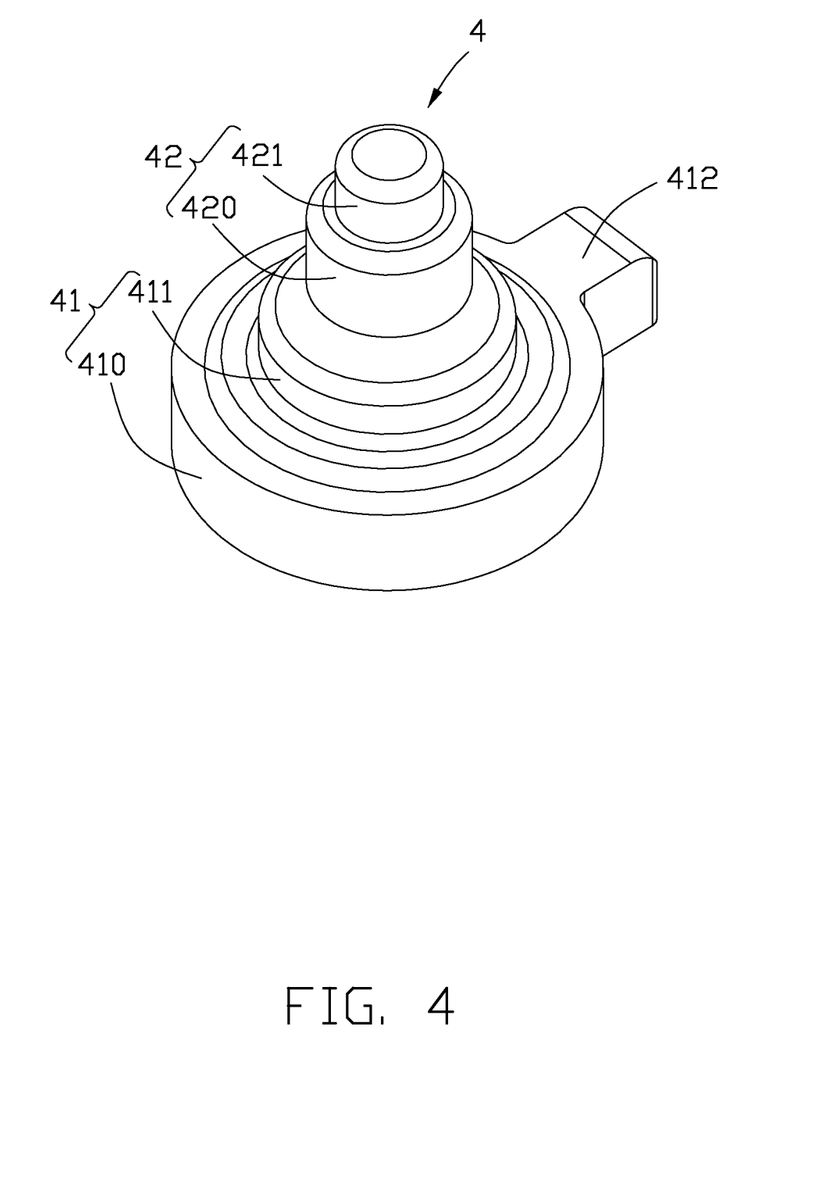
FIG. 4 is a perspective view of the cam of the electrical socket.
Figure 5:
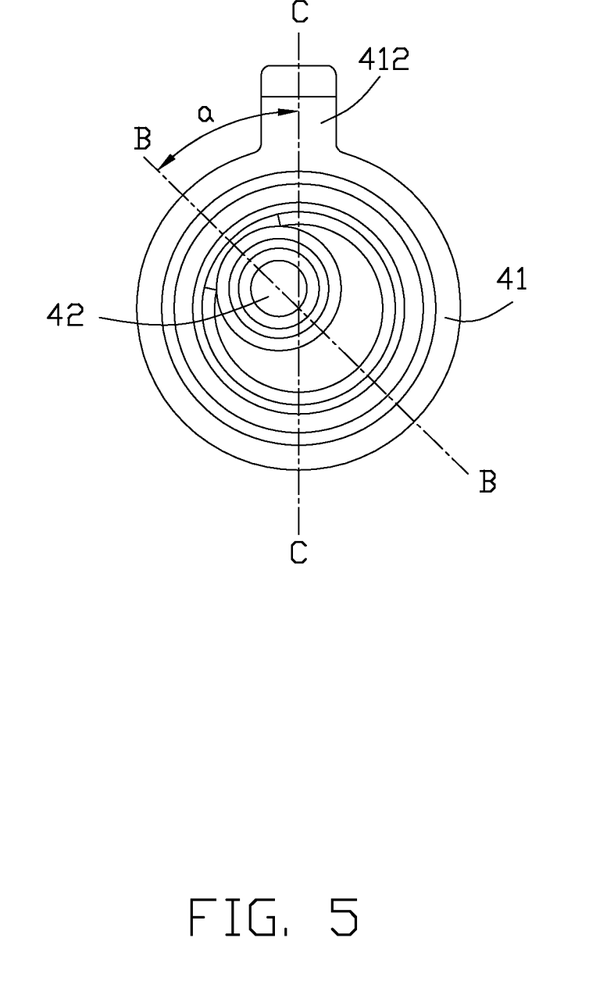
FIG. 5 is a top plan view of the cam showed FIG. 4.

Referring to FIGS. 4 and 5, the cam 4 includes an upper portion 41 and a lower portion 42. The upper portion 41 is composed of an upper disk 410 and a lower disk 411 coaxial with the upper disk 410. The upper disk 410 has a lateral protrusion or stopper device 412 protruding from a lateral side thereof. The lower portion 42 is formed under the upper portion 41 and parallel to but offset from the axis of the upper portion 41. The lower portion 42 includes an upper post 420 and a lower post 421 coaxial with the upper post 420. FIG. 5 shown the axes of the upper portion 41 connects with the lower portion 42 to form an axis line B-B, the axis of the upper portion 41 connects the center of the lateral protrusion 412 to form a connecting line C-C, the axis line B-B and the connecting line C-C has an acute angle "a".

Figure 6:
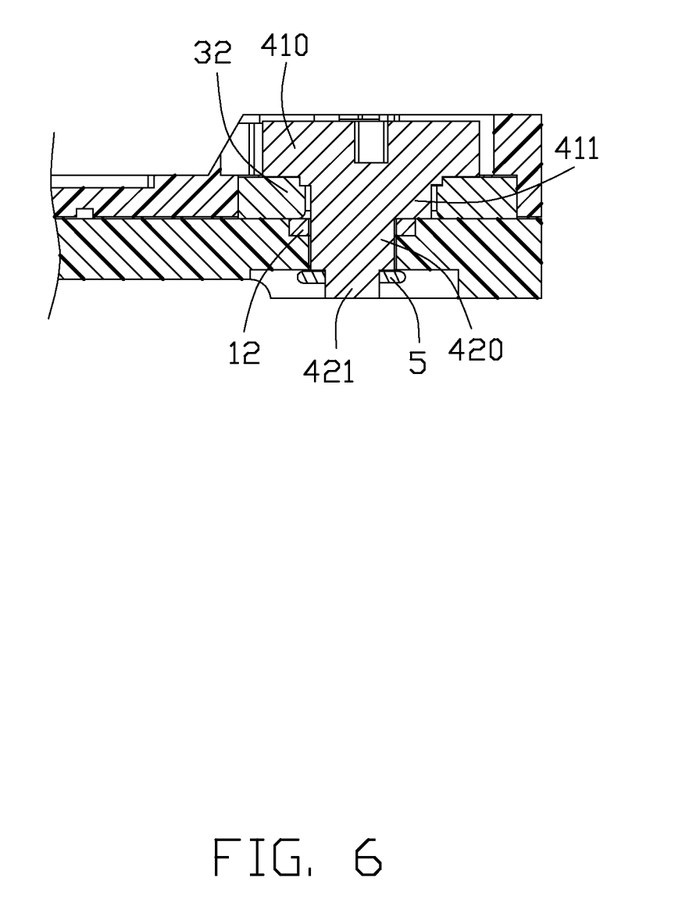
FIG. 6 is a cross-section view taken along line 6-6 of FIG. 5.

FIG. 6 shows the cam 4 assembled to the electrical socket. The upper portion 41 is assembled to the end portion 31 of the cover 3 and the lower portion 42 is assembled to the head portion 11 of the base 1. In specifically, the upper disk 410 is received in the accommodating hole 310 of the cover 3, the lower disk 411 is received in the aperture 320 of the cover plate 32, and the lower portion 42 is received in the through hole 110. The upper post 420 of the lower portion 42 engages with the base plates 12 and the lower post 421 is riveted used a washer 5 on a lower surface of the base 1.

In operation, the cam 4 is rotated around the axis of the lower portion 42 until the lateral protrusion 412 engages with one of the protrusions 321. Since the axis of the lower portion 42 is offset from the axis of the upper portion 40, the rotation of the cam 4 forces the cover 3 to slide along the base 1 in a horizontal direction, thereby making the pins 6 insert to or drop out the contacts 2.

Figure 7:
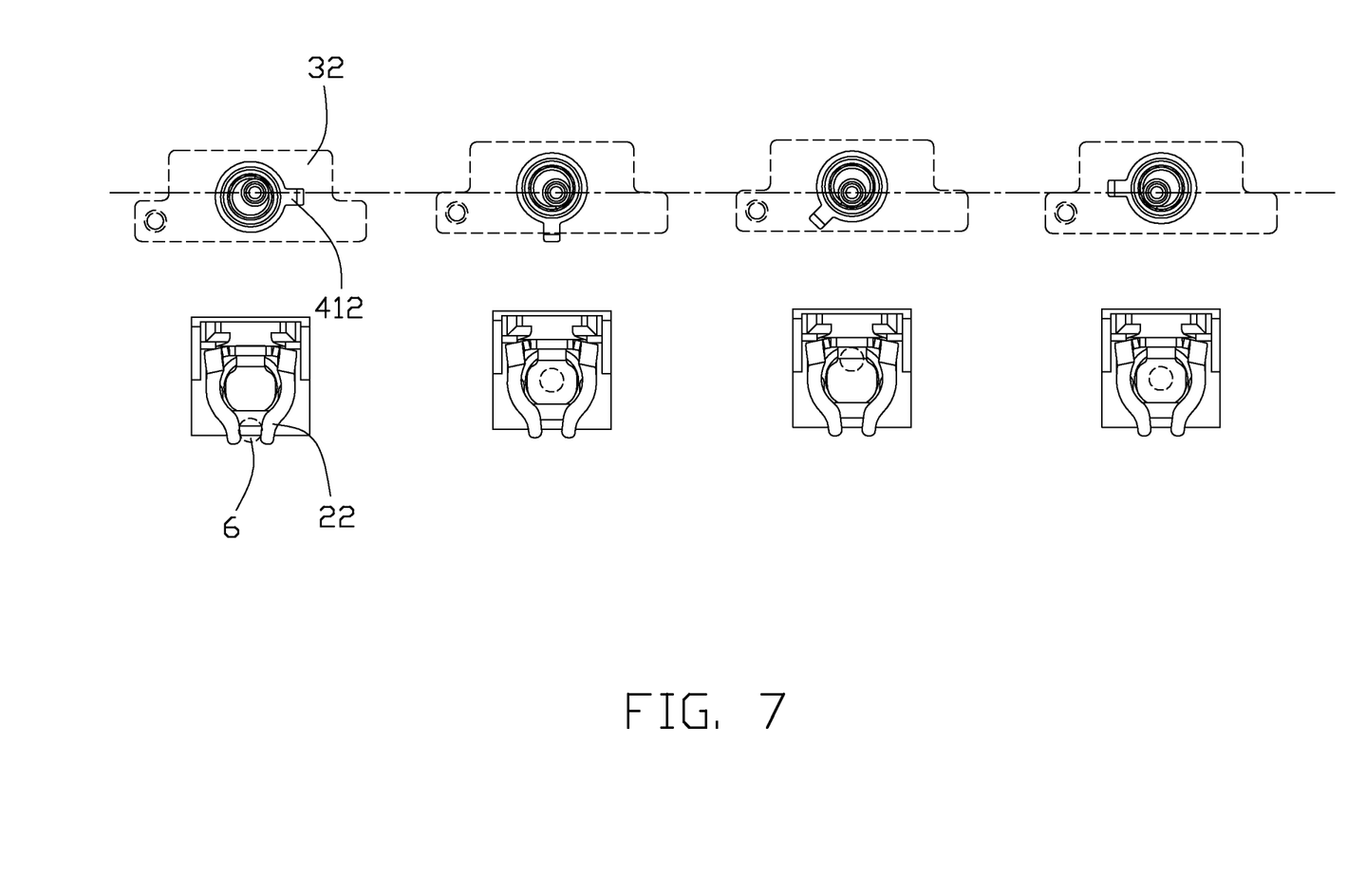
FIG. 7 is a schematic view of the electrical socket movement from closed position to open position.

FIG. 7 is a schematic view of the electrical socket moved from the closed position to the open position and shows the pins 6 dropping out of the contacts 2. In the instant invention, the cover 3 and pins 6 have a same moving path. In this embodiment, the acute angle "a" is substantially 45 degree. When the electrical socket is located at the closed position, the cover 3 is positioned at end of the receiving portion 10 and the pins 6 are clipped by the mating portions 22 of the contacts 2, the cover 3 and pins 6 at this position is defined a final position. Rotates the cam 4 to 90 degree's position, the cover 3 is moved towards the head portion 11 of the base 1 and substantially located at an original position. And then continue to rotate the cam 4 to substantially 145 degree's position, the cover 3 and the pins 6 move to a farthest position with regard to the final position. The cover 3 and pins 6 moved back from the farthest position to the original position when the cam 4 is rotated from 145 degree to the open position.

Because the angle between the axis line B-B and the connecting line C-C is an acute, the cover 3 and the pins 6 move along a linear return path from the open position to the closed position or from the closed position to the open position. FIG. 8 discloses a schematic view of the paths that the pin 6 moving with regard to the contact 2 from the open position to the closed position and from the closed position to the open position. The broken line D shows a schematic line that the pin 6 moving from the open position to the closed portion. In fact, the pin 6 moves along a line connected by the pin in the original position and in the final position. The broken line D showed as in FIG. 8 not a straight line just for clear showing the pin having a returned movement. The broken line E shows a schematic line that the pin 6 moves from the closed position to the open position. The pin 6 moves from the closed position to the open position also returned in a straight line. As showed in the broken line D and E, the pin 6 passes the original position two times.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical socket comprising:
   a base defining a plurality of passageways in a vertical direction;
   a plurality of contacts received in the passageways;
   a cover slidably mounted upon the base, the cover defining a plurality of holes corresponding to the passageways;
   a cam used for driving the cover horizontally moved along the base between an open position and a closed position, the cam including an upper portion and a lower portion offset from the upper portion, the upper portion having a lateral protrusion to restrict the cover located in the open position and the closed position with regard to the base;
   a center of the upper portion connecting a center of the lower portion to form a center line; wherein
   the center of the upper portion connecting a center of the lateral protrusion to form a connecting line; wherein
   the center line and the connecting line have an acute angle; and wherein
   the cover has an original position when the electrical socket located in the open position and has a final position and a farthest position located at two sides of the original position, the cover moves from the original position to the farthest position and then returned to the final position passing the original position when the electrical socket is moved from the open position to the closed position.

2. The electrical socket as claimed in claim 1, wherein the upper portion is composed of an upper disk and a lower disk coaxial with the upper disk, the lower portion includes an upper post and a lower post coaxial with the upper post.

3. The electrical socket as claimed in claim 2, wherein the cover includes a cover plate mounted at bottom thereof for increasing strength of the cover.

4. The electrical socket as claimed in claim 3, wherein the cover plate has a pair of protrusions to engage with the lateral protrusion to restrict the electrical socket in the open position or in the closed position.

5. The electrical socket as claimed in claim 4, wherein the cover plate defines a through aperture, and the lower disk of the upper portion is located in the through aperture and pushes the cover moved with regard to the base.

6. The electrical socket as claimed in claim 5, wherein the base defines a through hole to receive the lower portion of the cam.

7. An electrical socket used for an electronic package with a plurality of pins, comprising:
   a base defining a plurality of passageways in a vertical direction;
   a plurality of contacts received in the passageways;
   a cover slidably mounted upon the base, the cover defining a plurality of holes corresponding to the passageways and adapted to move together with the electronic package when the electronic package is mounted upon the cover with the pins extending into the corresponding holes, respectively;

a cam used for driving the cover horizontally moved along the base between an open position and a closed position; wherein the pins moves with regard to the contact in a linear return path when the electrical socket moves from the open position to the closed position or from the closed position to the open position; wherein the cam includes an upper portion and a lower portion offset from the upper portion, the upper portion having a lateral protrusion to restrict cover located in the open position or in the closed position with regard to the base; and wherein a center of the upper portion connects a center of the lower portion to form a center line and the center of the upper portion connects a center of the lateral protrusion to form a connecting line, and wherein the center line and the connecting line have an acute angle.

8. An electrical socket comprising:

an insulative base and an insulative cover back and forth moveable relative to the base in a front-to-back direction;

a plurality of contacts disposed in the base;

a cam assembled to said base and said cover in a rotational manner to actuate a back-and-forth movement of the cover relative to the base, said cam including an upper larger circular disk moveable, in the rotational manner, within a circular aperture associated within the cover, and a lower smaller post moveable, in the rotational manner, within a transversely spanning through hole associated within the base, a center axis of the post being offset from that of the disk, and a stopper device restricting rotation of the cam within 180 degrees corresponding to opposite open and closed positions of the cover relative to the base in the front-to-back direction; wherein the post is located at a first position relative to the disk when said cover is moved to the open position and at a second position relative to the disk when said cover is moved to the closed position, said first position and said second position being diametrically opposite to each other with regard to the disk, and forming therebetween a line extending along a direction oblique to the front-to-back direction; wherein said stopper device is located at a first position relative to the cover when said cover is moved to the open position and a second position relative to the cover when the cover is moved to the closed position, said first position and said second position being diametrically opposite to each other and forming therebetween a line extending in a transverse direction perpendicular to said front-to-back direction, and the line defined by the post is oblique to that defined by the stopper device.

9. The electrical socket as claimed in claim 8, wherein said circular aperture is formed within a metallic cover plate secured to the cover.

10. The electrical socket as claimed in claim 8, wherein the base is equipped with a pair of base plates sandwiching the transversely spanning through hole therebetween.

11. The electrical socket as claimed in claim 8, wherein the cover forms an accommodating hole receive an upper disk of the cam, said upper disk being located above the circular disk.

12. The electrical socket as claimed in claim 11, wherein the upper disk and the circular disk share the same center axis.

13. The electrical socket as claimed in claim 12, wherein said cam further includes another post below said post both of which share the same center axis.

* * * * *